(12) United States Patent
Vernickel et al.

(10) Patent No.: US 11,899,083 B2
(45) Date of Patent: Feb. 13, 2024

(54) RF TRANSMIT SYSTEM WITH SWITCHABLE POWER SUPPLY DEVICE

(71) Applicant: KONINKLIJKE PHILIPS N.V., Eindhoven (NL)

(72) Inventors: Peter Vernickel, Hamburg (DE); Christoph Leussler, Hamburg (DE); Ingo Schmale, Hamburg (DE); Jochen Keupp, Rosengarten (DE)

(73) Assignee: Koninklijke Philips N.V., Eindhoven (NL)

( * ) Notice: Subject to any disclaimer, the term of this patent is extended or adjusted under 35 U.S.C. 154(b) by 815 days.

(21) Appl. No.: 16/969,579

(22) PCT Filed: Feb. 15, 2019

(86) PCT No.: PCT/EP2019/053817
§ 371 (c)(1),
(2) Date: Aug. 13, 2020

(87) PCT Pub. No.: WO2019/158695
PCT Pub. Date: Aug. 22, 2019

(65) Prior Publication Data
US 2021/0116522 A1    Apr. 22, 2021

(30) Foreign Application Priority Data

Feb. 15, 2018 (EP) .................................. 18156891

(51) Int. Cl.
*G01R 33/36* (2006.01)
*H03F 1/02* (2006.01)
*H03F 3/19* (2006.01)

(52) U.S. Cl.
CPC ....... *G01R 33/3614* (2013.01); *H03F 1/0211* (2013.01); *H03F 3/19* (2013.01); *H03F 2200/451* (2013.01); *H03F 2200/511* (2013.01)

(58) Field of Classification Search
CPC ............ G01R 33/3614; G01R 33/5605; H03F 1/0211; H03F 3/19; H03F 2200/451;
(Continued)

(56) References Cited

U.S. PATENT DOCUMENTS

| 6,072,315 A | 6/2000 | Slade |
| 6,281,755 B1 | 8/2001 | Feld et al. |

(Continued)

FOREIGN PATENT DOCUMENTS

| EP | 2045913 A1 | 4/2009 |
| JP | 2008284270 A | 11/2008 |
| WO | 2012114217 A1 | 8/2012 |

OTHER PUBLICATIONS

Zhou J, Payen JF, Wilson DA, Traystman RJ, van Zijl PCM. "Using the amide proton signals of intracellular proteins and peptides to detect pH effects in MRI" Nature Medicine 2003; 9:1085.
(Continued)

*Primary Examiner* — G. M. A Hyder

(57) ABSTRACT

The present invention is directed to a RF transmit system (1) for a magnetic resonance examination system where it is intended to provide a solution for the problem of rapidly switching between operation modes of different peak power requirements at good power efficiencies. For this purpose the RF transmit system (1) comprises at least one RF channel (14) wherein the RF channel (14) has an RF amplifier (3), at least two power supply devices (4, 5) wherein each of the power supply devices (4, 5) is configured to supply a voltage to the amplifier (3). The RF transmit system (1) further comprises a DC switch (8) configured to switch the voltage supplied to the amplifier (3) between the power supply devices (4, 5) and a controller (2) configured to switch the voltage based on sensor data.

11 Claims, 2 Drawing Sheets

(58) Field of Classification Search
CPC .. H03F 2200/511; H03F 1/025; H03F 1/0266; H03F 3/189; H03F 3/24
See application file for complete search history.

(56) References Cited

U.S. PATENT DOCUMENTS

| | | |
|---|---|---|
| 2008/0079488 A1 | 4/2008 | Albrecht et al. |
| 2008/0143438 A1* | 6/2008 | Albrecht ............... H03F 1/0244 330/147 |
| 2012/0309333 A1 | 12/2012 | Nambu et al. |
| 2014/0152390 A1 | 6/2014 | McMorrow et al. |
| 2017/0102441 A1 | 4/2017 | Ganesh et al. |
| 2017/0261573 A1 | 9/2017 | Nakamura et al. |

OTHER PUBLICATIONS

Zhou J, Tryggestad E, Wen Z, Lal B, Zhou T, Grossman R, Wang S, Yan K, Fu DX, Ford E, Tyler B, Blakeley J, Laterra J, van Zijl PCM. "Differentiation between glioma and radiation necrosis using molecular magnetic resonance imaging of endogenous proteins and peptides" Nature Medicine 2011; 17:130.
International Search Report and Written Opinion from PCT/EP2019/053817 dated Apr. 26, 2019.

* cited by examiner

RF TRANSMIT SYSTEM WITH SWITCHABLE POWER SUPPLY DEVICE

CROSS REFERENCE TO RELATED APPLICATIONS

This application is a U.S. national phase application of International Application No. PCT/EP2019/053817 filed on Feb. 15, 2019, which claims the benefit of EP Application Serial No. 18156891.6 filed on Feb. 15, 2018 and is incorporated herein by reference.

FIELD OF THE INVENTION

The invention relates to the field of a RF transmit system, and in particular to a RF transmit system with a switchable power supply device, a magnetic resonance examination system comprising such a RF transmit system with a switchable power supply device, a method of operating such a RF transmit system and a computer program comprising a computer program code adapted to perform the method.

BACKGROUND OF THE INVENTION

The overall aim of the transmit RF chain is to generate a desired spin excitation in a minimum period of time, while complying with technological and biological limits. The transmit RF chain of a MRI system contains several high power RF amplifiers, which drive a MRI coil. The RF chain consists of a digital RF pulse generator, a RF amplifier, analogue S/R switches and the MRI antenna. Multi-channel transmission may be required for RF shimming and for equally distributing the RF power in the coil. MRI offers a wide range of contrast mechanisms based on a variety of chemical and physical parameters. This variety results in extraordinary demands for the RF pulses to excite the spins or achieve certain effects. The operational demands are high power in short term applications (1-10 kW in the order of 1 ms), low power for continuous applications (<100 W in the order of seconds) and mid power for midterm applications (0.1-1 kW in the order of 50 ms). For certain applications, such as amide proton transfer (APT) weighted imaging, the operational demands may change with less than a millisecond. Only this short time frame is available for switching, e.g. between preparation pulses and imaging pulses. In addition, fixed absolute technical limits need to be respected, such as for the maximum peak power of the amplifier or for maximum coil currents. Others parameters are more flexible and depend on the temporal evolution of the RF waveforms, such as the maximum available short term average RF power, which depends on the pulse shape and the recently applied RF power.

In order to achieve the 16 kW (=10×1.6 kW) forward power one has to set Vds=50 V. The amplifier operates very efficiently when it is used near max. RF power. The efficiency is >70% indicating an efficient use of the DC power provided. At the same time heating and parameter drift remains limited due to the comparably low losses. On the other hand, at 500 W (10×50 W) the efficiency is below 20%. Combined with the long pulse duration of the pulse train in the order of second this is very challenging for the capacitor bank and the power supply. The voltage drop during the pulse might be too large so that the desired envelope is not realizable. If one could choose Vds=25 V, the efficiency is much higher. So for an optimal efficiency at low RF powers the requirements for the capacitor bank and the DC power supply change. However, due to the relatively large capacitance of the capacitor bank and the slow reaction time of the DC power supplies, changing the drain voltage within milliseconds is impossible.

SUMMARY OF THE INVENTION

State of the art RF amplifiers are optimized for one operation mode with the consequence that the RF pulses of other types cannot be realized or at least only very inefficiently with respect to DC power and cooling demands. Certain amplifiers offer multiple operation modes, but because of its technical realization, switching takes in the order of seconds or even minutes, rendering the application of the mode switch in the aforementioned APT sequences impossible.

It is an object of the invention to solve the problem of rapidly switching between operation modes of different peak power requirements at good power efficiencies.

According to the invention, this object is addressed by the subject matter of the independent claims. Preferred embodiments of the invention are described in the sub claims.

Therefore, according to the invention, the object is achieved by a RF transmit system for a magnetic resonance examination system, the RF transmit system comprises:
- at least one RF channel wherein the RF channel has an RF amplifier,
- at least two power supply devices wherein each of the power supply devices is configured to supply a voltage to the amplifier,
- a DC switch configured to switch the voltage supplied to the amplifier between the power supply devices,
- a controller configured to switch the voltage based on sensor data.

The basic idea of the invention is to integrate at least two different voltages from two different power supply devices and to smartly adapt e.g. to switch the optimal voltage to the RF amplifier. The invention enables to operate the amplifier at high peak-power at high drain voltage as well as at a low peak-power at low drain voltage wherein in both modes of operation a high power efficiency is achieved.

In a preferred embodiment the at least one capacitor bank is connected to a conductor path between the power supply device and the RF amplifier. In order to compensate a voltage drop at the time of the operation of the amplifier, the capacitor bank supplies power to the amplifier as needed.

In a preferred embodiment the switch, the power supply devices and the capacitor banks are associated to a plurality of amplifiers. This is advantageous so that the amplifiers have a common voltage supply.

In another preferred embodiment the power supply device is permanently connected to the corresponding capacitor bank.

In a preferred embodiment the amplifier consists of a group of FETS.

In another preferred embodiment the DC switch is a solid-state switch or a mechanical switch or a MEMS switch or a vacuum switch. A solid-state switch is advantageous because solid-state switches are fast and the switching can be done within fractions of ms. Another advantage is that solid-state switches are easy to realize as it can be realized such that switching is done only while the current is zero.

In a preferred embodiment is the DC switch is a switching matrix. A switching matrix is advantageously when a plurality of power supply devices and amplifiers are used to easily select within a short time frame the desired configuration of power supply device and amplifier.

In another preferred embodiment the switch and/or the capacitator banks are located close to the RF amplifier or are integrated into the amplifier.

In a preferred embodiment the controller manages parameters based on sensor data depending on the RF sequence demands. The RF sequence demands are an interaction of different parameters of the magnetic resonance examination system.

In another preferred embodiment the parameters are parameters from the capacitor bank and/or switch and/or MR sequence controller and/or power supply and/or RF amplifier. These parameters are mandatory to ensure safe operation within the technical limits as well as to set correct controller parameters such as gain.

In another aspect of the invention, the object is achieved by a magnetic resonance examination system comprising a RF transmit system disclosed above.

In another aspect of the invention, the object is achieved by a method of operating an embodiment of the RF transmit system disclosed herein in the magnetic resonance examination system disclosed above. The method includes steps of:
  starting a MR examination,
  selecting a MR method,
  starting a MR sequence,
  managing parameters by the controller depending on the RF sequence demands,
  switching the voltage depending on the controller,
  finishing MR sequence,
  repeating the procedure.

In a preferred embodiment the method for operating a RF transmit system further comprises the steps of:
  switching the voltage by the DC switch multiple times during the MR sequence.

Since MRI offers a wide range of contrast mechanisms based on a variety of chemical and physical parameters. This variety results in extraordinary demands for the RF pulses to excite the spins or achieve certain effects. Therefore, depending on the MR sequence and the clinical demands it's advantageous to switch the voltage multiple times during a MR sequence.

In another aspect of the invention, the object is achieved by a computer program comprising a computer program code adapted to perform a method or for use in a described above when said program is run on a programmable microcomputer.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
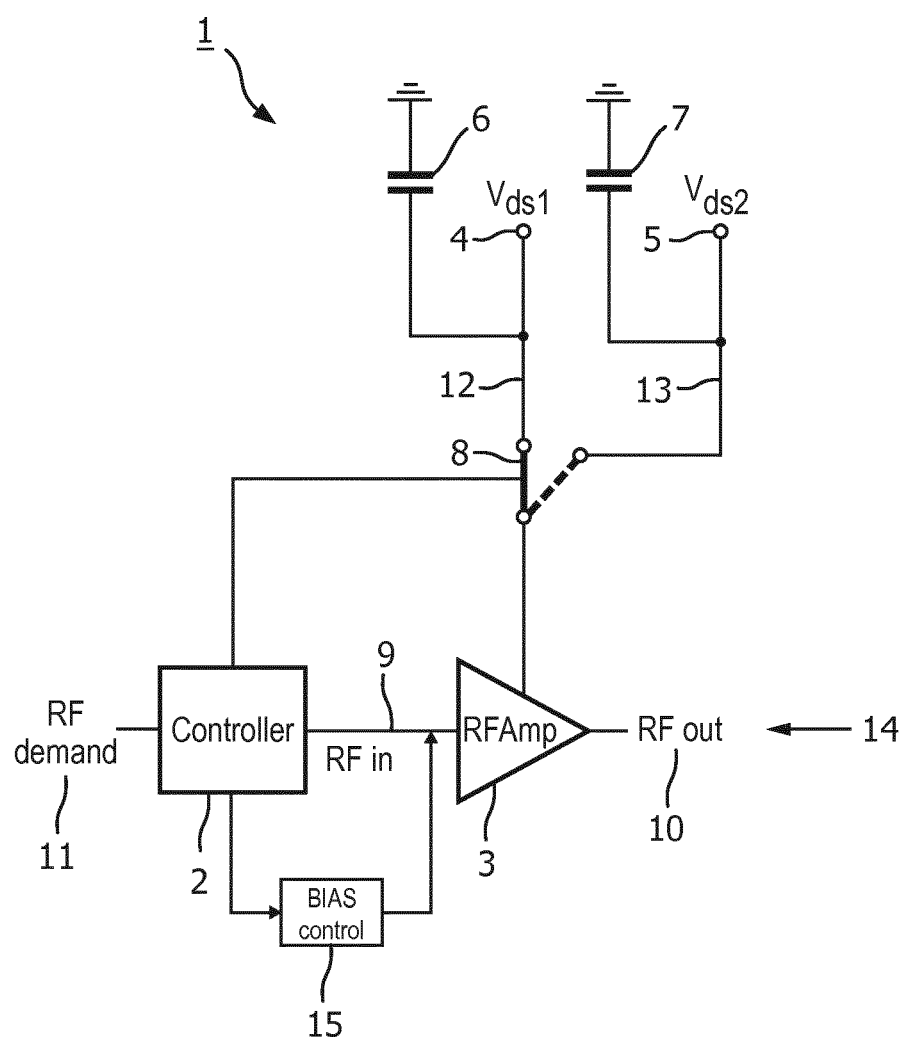
FIG. 1 shows a schematic illustration of a part of a magnetic resonance examination system including an embodiment of a RF transmit system in accordance with a preferred embodiment of the present invention.

FIG. 1 shows a schematic illustration of a part of a magnetic resonance examination system including an embodiment of a RF transmit system 1 in accordance with a preferred embodiment of the present invention. The RF transmit system 1 comprises an amplifier 3 configured to amplify an input signal 9 and configured to output the amplified input signal 9 as output signal 10. The operational properties of the RF amplifier 3 depend on the bias point Idq the quiescent drain-source current and the drain voltage Vds. A typical MRI amplifier with a 16 kW forward power is formed by putting FETS together. The DC drain voltage Vds is supplied from a power supply device 4, 5. To realize the high energy demands in a short time frame a capacitor bank 6, 7 is connected to the conductor path 12, 13 between the power supply 4, 5 and the amplifier 3. The capacitor bank 6, 7 gets recharged during and after the end of the RF pulses before the next pulse starts. Typically its capacitance is in the order of 100 mF. Optimizing capabilities of capacitor bank 6, 7 and power supply 4, 5 is mandatory and has substantial impact on the costs of such a device. In order to achieve e.g. 16 kW (=10×1.6 kW) forward power one has to set (e.g.) Vds=50 V. The RF amplifier 3 operates very efficiently when it is used near max. RF power. The efficiency can be >70% indicating an efficient use of the DC power provided. At the same time heating and parameter drift remains limited due to the comparably low losses. In certain MRI application high power (e.g. 16 kW) with short duration may be mixed with pulses of low power (500 W) but long pulse durations. A However, at 500 W (10×50 W) the efficiency is very low, e.g. below 20%. Combined with the long pulse duration of the pulse in the order of seconds this is very challenging for the capacitor bank 6, 7 and the power supply 4, 5, and the cooling system of the amplifier and power supply. The voltage drop or heat dissipation during the pulse might be too large so that the desired envelope of the RF signal is not realizable. If one could choose a different lower drain voltage, e.g. Vds=25 V, the efficiency is much higher. So for an optimal efficiency at low RF powers, the requirements for the capacitor bank 6, 7 and the DC power supply device 4, 5 change. Therefore, two different power supply devices 4, 5 are shown in FIG. 1, wherein each of the power supply devices 4, 5 is configured to supply a voltage to the RF amplifier 3. A DC switch 8 is foreseen to change the voltages between the two power supply devices 4, 5. The DC switch 8 can also be a solid-state switch. Solid-state switches can be realized easily as it can be realized such that switching is done only while the current is zero. Another advantage of a solid-state switch is that they are fast, so that the voltage can be changed even during a MR Sequence within ms. The DC switch 8 can also be a switching matrix when a plurality of power supply devices 4, 5 are used. To each of the conductor paths 12, 13 between the power supply device 4, 5 and the DC switch 8 a capacitor bank 6, 7 is connected. The capacitor bank 6, 7 stores electric charge which comes from the power supply device 4, 5. In order to compensate a voltage drop at the time of the operation of the RF amplifier 3, the capacitor bank 6, 7 supplies power to the RF amplifier 3 as needed. Specifically, the capacitor bank 6, 7 functions as a battery for supplying excess power that cannot be delivered by the power supply device 4, 5. The DC switch 8 and the RF amplifier 3 are connected to a controller 2. By changing the drain voltage, the gain of the RF amplifier 3 changes as well. Therefore, the RF input level and/or the bias point have to be adapted as well. The controller 2 manages individual parameters from the magnetic resonance examination system 1 depending on the RF sequence demands 11. The controller 2 is adapted to manage information from the DC switch 8, the capacitor banks 6, 7, the MR sequence controller, the power supply devices 4, 5 and from the RF amplifier 3. With the information analysed by the controller 2, the power supply devices 4, 5 together with the capacitor banks 6, 7 can be switched to the RF amplifier 3 in dependence of the required gain setting. In an embodiment of the invention the controller can already get the information about the RF demand in advance so that he can switch the voltage prospectively. The power supply device 4, 5 of the invention can rapidly switch between at least two modes of operation. This enables clinically practical acquisition sequences of which the power requirements in preparation and signal generation are different, such as in ATP-sequences. In an embodiment of the invention a bias control 15 is foreseen. By changing Vds a change of the bias settings may be necessary to get back to an appropriate working point of the amplifier. The bias control is essentially a stabilized current or voltage source.

Figure 2:
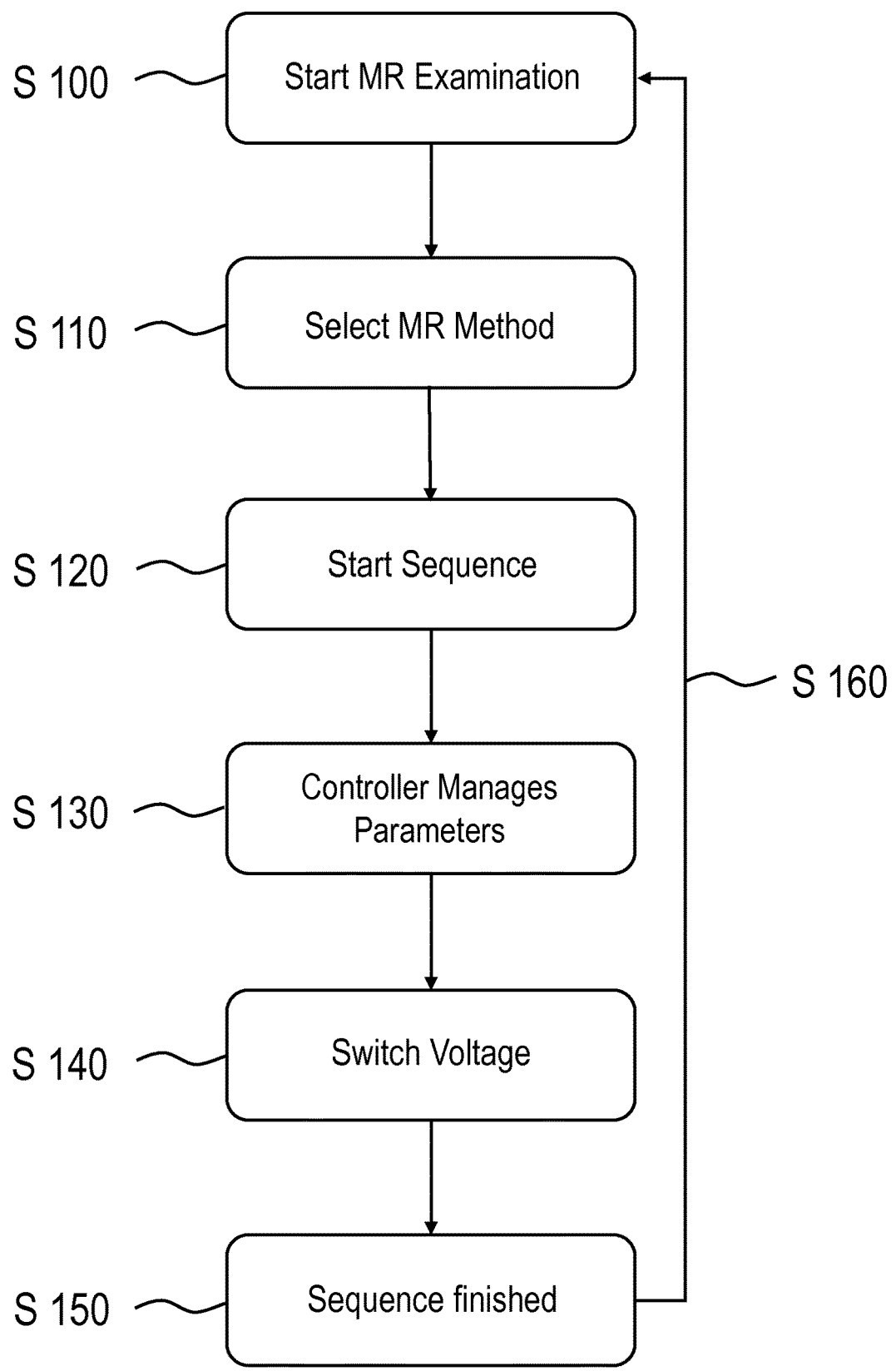
FIG. 2 shows a flow chart in accordance with a preferred embodiment of the present invention.

FIG. 2 shows a flow chart in accordance with a preferred embodiment of the present invention. The flow chart starts with step 100, according to which the MR examination is started. In step 110 the MR Method is selected and in step 120 the MR sequence is started. During a MR sequence it's sometimes necessary to realize a high energy demand in a short time frame. For this purpose the controller 2 manages in step 130 individual parameters of the magnetic resonance examination system. The parameters can be parameters obtained by sensors from the DC switch 8, the capacitor banks 6, 7, the MR sequence controller, the power supply devices 4, 5 and the status from the RF amplifier 3. The controller 2 manages the individual parameters depending on the RF sequence demands and switches with the DC switch 8 in step 140 the voltage between the power supply devices 4, 5 to the optimal voltage during the MR sequence. In an embodiment of the invention the switching within a sequence is also possible several times. Depending on the MR sequence and the clinical demands the voltage can also be switched multiple times during a MR sequence. In step 150 the MR sequence is finished and the procedure is repeated in step 160.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

RF transmit system 1
controller 2
RF amplifier 3
power supply device 4
power supply device 5
capacitor bank 6
capacitor bank 7
switch 8
RF input channel 9
RF output channel 10
RF demand signal 11
conductor path 12
conductor path 13
RF channel 14
BIAS control 15

The invention claimed is:

1. A radio frequency (RF) transmit system for a magnetic resonance examination system, the RF transmit system comprising:
at least one RF channel, wherein the RF channel has an RF amplifier,
the RF amplifier,
at least two power supply devices, wherein each of the power supply devices is configured to supply a voltage to the RF amplifier, wherein the power supply devices are different than each other and configured to provide different voltages than each other,
a direct current (DC) switch configured to switch the voltage supplied to the RF amplifier between the power supply devices to switch an operating point of the RF amplifier between high peak-power at high drain voltage and low peak-power at low drain voltage,
conductor paths between the DC switch and each of the power supply devices,
at least one capacitor bank connected to each of the conductor paths and to the DC switch, and
a controller configured to receive sensor data representative of parameters from sensors associated with least one of the DC switch, capacitor banks, a magnetic resonance (MR) sequence controller, the power supply devices, or the RF amplifier, wherein the controller is further configured to switch the voltage based on the sensor data during an MR pulse sequence.

2. The RF transmit system of claim 1, wherein the switch, the power supply devices, and the capacitor banks are associated to a plurality of amplifiers.

3. The RF transmit system of claim 1, wherein each capacitor bank corresponds to one of the power supply devices, wherein each power supply device is permanently connected to the corresponding capacitor bank.

4. The RF transmit system of claim 1, wherein the RF amplifier comprises a plurality of field effect transistors (FETs).

5. The RF transmit system of claim 1, wherein the DC switch is a solid-state switch or a mechanical switch or a micro-electro-mechanical systems (MEMS) switch or a vacuum switch.

6. The RF transmit system of claim 1, wherein the DC switch is a switching matrix.

7. The RF transmit system of claim 1, wherein the controller is configured to manage the parameters based on the sensor data depending on demands of the RF sequence.

8. A magnetic resonance examination system comprising the RF transmit system of claim 1.

9. A method for operating the RF transmit system of claim 1, the method comprising:
(1) starting the MR pulse sequence,
(2) managing parameters by the controller based on the sensor data depending on demands of the RF sequence,
(3) switching the voltage supplied to the RF amplifier by the DC switch depending on the controller to switch the operating point of RF amplifier between the high peak-power at the high drain voltage and the low peak-power at the low drain voltage, (4) finishing the MR pulse sequence,
repeating operations (1) through (4).

10. The method of claim 9, further comprising:
switching the voltage provided to the amplifier by the DC switch multiple times during the MR pulse sequence.

11. A non-transitory computer reading medium having stored thereon computer program code adapted to be executed on a processor to perform the method of claim 9.

* * * * *